United States Patent [19]
Torigoe et al.

[11] Patent Number: 5,789,734
[45] Date of Patent: Aug. 4, 1998

[54] EXPOSURE APPARATUS THAT COMPENSATES FOR SPHERICAL ABERRATION OF AN IMAGE FORMING DEVICE

[75] Inventors: Makoto Torigoe; Akiyoshi Suzuki, both of Tokyo, Japan

[73] Assignee: Canon Kabushiki Kaisha, Tokyo, Japan

[21] Appl. No.: 242,442

[22] Filed: May 13, 1994

[30] Foreign Application Priority Data

May 14, 1993 [JP] Japan .................. 5-136886

[51] Int. Cl.$^6$ .................................................. G01N 21/86
[52] U.S. Cl. ...................... 250/201.2; 250/548; 356/401
[58] Field of Search .................... 250/201.2, 548; 356/399–401; 355/53–56, 46

[56] References Cited

U.S. PATENT DOCUMENTS

| | | | |
|---|---|---|---|
| 4,634,240 | 1/1987 | Suzuki et al. | 350/508 |
| 4,688,932 | 8/1987 | Suzuki | 355/51 |
| 4,711,568 | 12/1987 | Torigoe et al. | 355/68 |
| 4,739,373 | 4/1988 | Nishi et al. | 355/53 |
| 4,789,222 | 12/1988 | Ota et al. | 355/46 |
| 4,801,977 | 1/1989 | Ishizaka et al. | 355/30 |
| 4,853,756 | 8/1989 | Matsuki | 355/71 |
| 4,875,076 | 10/1989 | Torigoe et al. | 355/53 |
| 4,888,614 | 12/1989 | Suzuki et al. | 355/43 |
| 4,894,611 | 1/1990 | Shimoda et al. | 324/158 R |
| 4,905,041 | 2/1990 | Aketagawa | 355/53 |
| 4,908,656 | 3/1990 | Suwa et al. | 355/53 |
| 4,965,630 | 10/1990 | Kato et al. | 355/52 |
| 4,974,736 | 12/1990 | Okunuki et al. | 219/121.12 |
| 4,988,188 | 1/1991 | Ohta | 353/122 |
| 5,117,254 | 5/1992 | Kawashima et al. | 355/43 |
| 5,286,963 | 2/1994 | Torigoe | 250/201.2 |
| 5,305,054 | 4/1994 | Suzuki et al. | 355/53 |
| 5,311,362 | 5/1994 | Matsumoto et al. | 359/738 |
| 5,424,552 | 6/1995 | Tsuji et al. | 250/548 |
| 5,448,336 | 9/1995 | Shiraishi | 355/71 |

FOREIGN PATENT DOCUMENTS

| | | |
|---|---|---|
| 60-214335 | 10/1986 | Japan . |
| 02166719 | 6/1990 | Japan . |

OTHER PUBLICATIONS

Matsumoto, et al., "Issues and Method of Designing Lenses for Optical Lithography," Optical Engineering, vol. 13, No. 12, Dec. 1992, pp. 2657 through 2665.

*Primary Examiner*—Stephone Allen
*Attorney, Agent, or Firm*—Fitzpatrick, Cella, Harper & Scinto

[57] ABSTRACT

An exposure apparatus wherein an image forming system forms an image of a pattern upon a photosensitive layer, and a detecting system detects a spherical aberration of the image forming system. The detected spherical aberration of the image forming system is adjusted or controlled in a suitable way, whereby correct pattern transfer operation is assured.

6 Claims, 6 Drawing Sheets

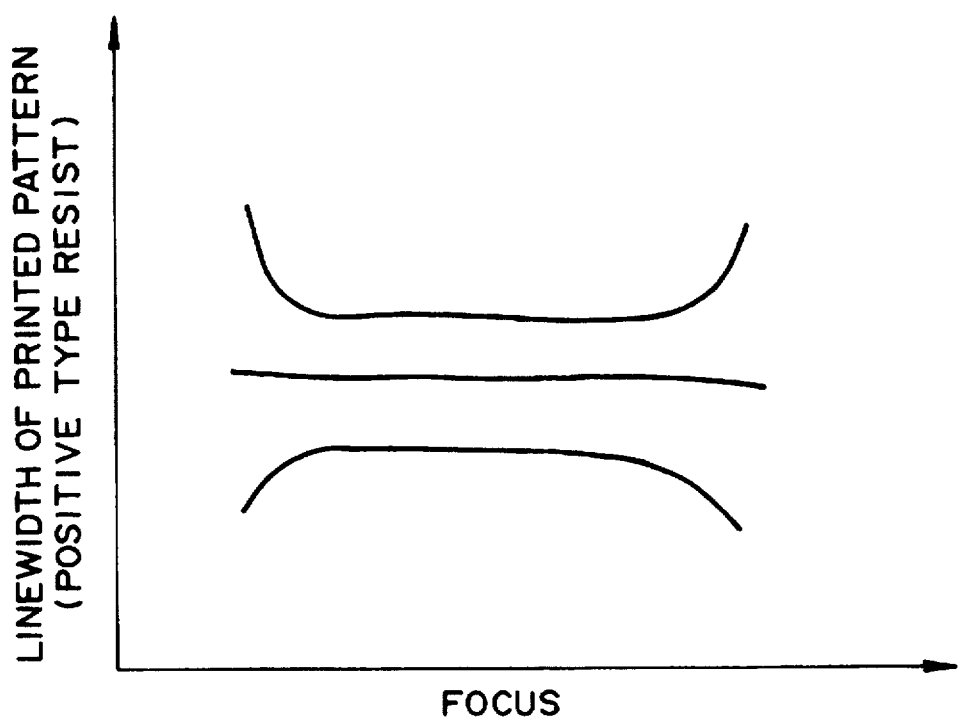
F I G. 2
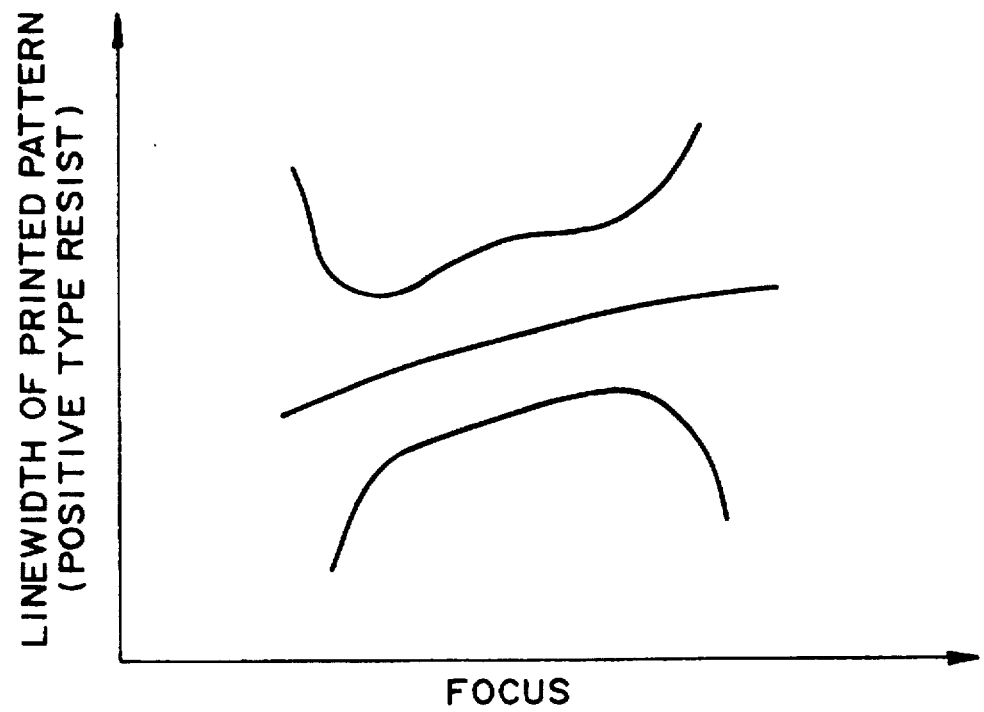
F I G. 3

EXPOSURE APPARATUS THAT COMPENSATES FOR SPHERICAL ABERRATION OF AN IMAGE FORMING DEVICE

FIELD OF THE INVENTION AND RELATED ART

This invention relates to an exposure apparatus and, more particularly, to a projection exposure apparatus of the type called a stepper, for projecting and printing in a reduced scale a circuit pattern of a reticle onto different portions of a wafer.

Recent needs for further miniaturization and a higher degree of integration of patterns of a semiconductor device such as LSI, VLSI and the like, necessitate use of an imaging (protection) optical system having a high resolving power in a projection exposure apparatus.

Conventionally, many attempts have been made in projection optical systems of steppers for reducing aberrations to improve the resolution performance. As regards coma and astigmatism, for example, among various aberrations, a projection optical system is usually set so that they are reduced nearly to zero over the whole range of the numerical aperture of the projection optical system.

In order to assure further improvements in resolution recently required, the numerical aperture (NA) of a projection lens has been enlarged, up to an order not less than 0.5.

It has been recently found that, if a projection optical system has a large NA, reducing all the aberrations of the projection optical system to zero (i.e., to have no aberration) is not always the best way in projection of a pattern of a reticle upon a resist of a wafer. This is because the imaging is made onto a material (resist) which has a thickness of a finite size (aberration free may be best if the imaging is made onto a material having a thickness of zero). It is known that, even in a complete aberration-free state, multiple reflection within a resist causes an undesirable phenomenon called "tilt of pivotal".

The phenomenon "tilt of pivotal" is such a phenomenon that, when defocused, a straight line ("pivotal") along which the linewidth of a pattern with correct exposure changes linearly does not become flat as illustrated in FIG. 2, but becomes inclined as illustrated in FIG. 3. If this occurs, then any defocusing due to some factor in a process or the like directly results in a change in linewidth of a pattern. In FIGS. 2 and 3, correct exposure is shown as a generally straight line, with over exposure shown above and under exposure shown below correct exposure.

SUMMARY OF THE INVENTION

It is an object of the present invention to provide an improved projection exposure apparatus, by which the inconveniences described above can be reduced satisfactorily.

In accordance with an aspect of the present invention, there may be provided a projection exposure apparatus wherein, in lithographic projection of a pattern of a first object such as a reticle as illuminated with light from an illumination optical system onto a surface of a second object such as a wafer through a projection optical system, a spherical aberration of the projection optical system is measured by use of a spherical aberration measuring means and wherein, in response to a signal from the aberration measuring means, a control means controls the spherical aberration of the projection optical system to a predetermined level.

The control means may move an optical element or elements of the projection optical system to control the spherical aberration of the projection optical system.

The or each optical element may comprise one lens element and it may be moved along the optical axis. The optical elements may comprise two optical wedges disposed opposed to each other to provide in combination a parallel flat plate, and these optical wedges may be moved relative to each other in a direction perpendicular to the optical axis to change the thickness in the direction of the optical axis.

The control means may interchangeably insert/retract an optical element or elements of the projection optical system, such as, for example, plural parallel flat plates of different thicknesses, to control the spherical aberration of the projection optical system.

The control means may change the refractive index of a gas in a space between optical elements of the projection optical system to control the spherical aberration of the projection optical system.

On that occasion, for example, the pressure of the gas between optical elements may be changed to change the refractive index. Alternatively, the gas between optical elements may consist of mixed different gaseous fluids and the ratio of mixture of the gaseous fluids may be changed to change the refractive index of the gas.

The control means may heat/cool the projection optical system to control the spherical aberration of the projection optical system.

The control means may change the wavelength of light from the illumination optical system to control the spherical aberration of the projection optical system.

The control means may change the bandwidth of light from the illumination optical system to control the spherical aberration of the projection optical system.

The second object may comprise a semiconductor wafer having a photoresist applied thereto, and the spherical aberration measuring means may measure the spherical aberration of the projection optical system on the basis of a change in linewidth, due to defocus, of the pattern of the first object being projected and printed on the photoresist.

On that occasion, the spherical aberration controlling means may control the spherical aberration of the projection optical system by minimizing the change in linewidth of the pattern due to defocus.

The first object may have a mark; light from the mark of the first object may be collected by the projection optical system to a reflective surface of the second object or of a member provided in the vicinity thereof; reflected light from the reflective surface (or reflected light from the reflective surface as the reflective surface or the first object is displaced in the direction of the optical axis of the projection optical system) may be collected again by the projection optical system to a vicinity of the mark of the first object and, subsequently, may be detected by a detecting means; and the spherical aberration measuring means may detect the spherical aberration of the projection optical system on the basis of a signal from the detecting means.

A mark may be provided in the vicinity of the second object; the mark (or the mark as it is displaced in the direction of the optical axis of the projection optical system) may be illuminated with light from the illumination optical system from a side remote from the projection optical system; light from the mark as illuminated may be collected by the projection optical system to a vicinity of the first object; the light may be then reflected by the surface of the first object at the side facing the projection optical system; the light may be then collected again by the projection optical system to the second object, adjacent to the mark; the light may subsequently be detected by a detecting means; and the spherical aberration measuring means may detect the spherical aberration Of the projection optical system on the basis of a signal from the detecting means.

A first mark may be provided on the first object; a second mark may be provided at a position whereat it may be substantially superposed with an image of the first mark as projected by the projection optical system upon the second object, the second mark being of a shape analogous to the first mark and having a size equal to the size of the first mark being multiplied by the imaging magnification of the projection optical system; light from the second mark (or light from the second mark as the same or the first object is displaced in the direction of the optical axis of the projection optical system) may be detected by a detecting means; and the spherical aberration measuring means may detect the spherical aberration of the projection optical system on the basis of a signal from the detecting means.

A second mark may be provided on the second object; a first mark may be provided at a position where it may be substantially superposed with an image of the second mark as projected by the projection optical system upon the first object, the first mark being of a shape analogous to the second mark and having a size equal to the size of the second mark being multiplied by the imaging magnification of the projection optical system; light from the first mark (or light from the first mark as the same or the second object is displaced in the direction of the optical axis of the projection optical system) may be detected by a detecting means; and the spherical aberration measuring means may detect the spherical aberration of the projection optical system on the basis of a signal from the detecting means.

Exposure hysteresis measuring means may measure exposure hysteresis as the pattern of the first object is projected and printed on the second object by the projection optical system, and the spherical aberration measuring means may measure the spherical aberration of the projection optical system by calculation on the basis of a signal from the exposure hysteresis measuring means.

A certain limit may be set in relation to the amount of correction of the spherical aberration to be controlled and, if the amount of change of the spherical aberration or a predicted amount thereof does not exceed that limit, no correction may be made to the spherical aberration.

The correction of spherical aberration may be made at the time of water replacement.

In accordance with a further aspect of the present invention, there may be provided a projection exposure apparatus in which, in projection of a pattern of a first object as illuminated with light from an illumination optical system onto a second object through a projection optical system, spherical aberration of the projection optical system is controlled by a control means to a predetermined level, while an optical characteristic or characteristics other than the spherical aberration are corrected on the other hand.

The optical characteristic to be corrected may be at least one of focus, projection magnification and distortion.

The control means may be arranged to perform at least one of moving the second object in the direction of the optical axis of the projection optical system, moving an element or elements of the projection optical system, and changing the refractive index of a gas between optical elements of the projection optical system; and the number of the optical characteristics to be corrected, including the spherical aberration, may be equal to the number of controls to be made by the control means.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 2 is a graph for explaining the relationship of focus vs. printed linewidth where there occurs no tilt of pivotal.

FIG. 3 is a graph for explaining the relationship of focus vs. printed linewidth where there occurs tilt of pivotal.

DESCRIPTION OF THE PREFERRED EMBODIMENTS

Figure 1:
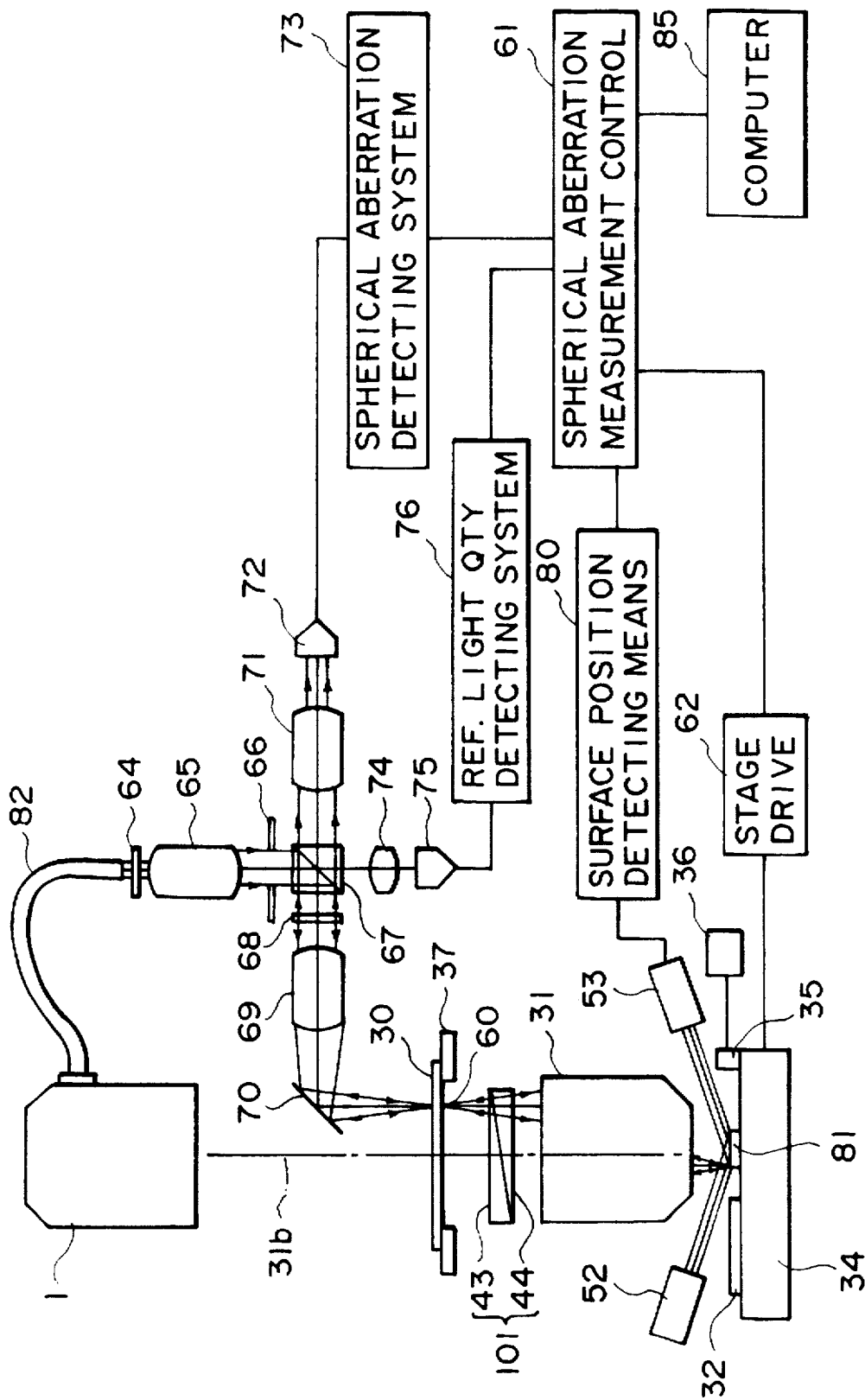
FIG. 1 is a schematic view of a main portion of a projection exposure apparatus according to a first embodiment of the present invention.

FIG. 1 is a schematic view of a main portion of a first embodiment of the present invention.

Denoted in the drawing at 30 is a reticle or photomask (original) which is supported by a reticle stage 37. A circuit pattern formed on the reticle 30 is imaged in a reduced scale of 1:5 upon a wafer 32 by a projection optical system (reduction projection lens) 31, for exposure thereof. The wafer is placed on an X-Y-Z stage (holding means) 34.

The projection optical system 31 is of a telecentric structure both on its entrance side and its exit side. Denoted at 101 is an optical member for correcting a spherical aberration. It comprises two optical wedges 43 and 44 disposed opposed to each other to provide in combination a parallel flat plate. These two optical wedges 43 and 44 are movable relative to each other in a direction perpendicular to the optical axis 31b of the projection optical system 31, such that the thickness of the optical member 101 can be changed. Details of the optical member 101 will be explained later.

In FIG. 1, provided in juxtaposition to the wafer 32 is a reference flat (reflection surface means) 81 having a surface of substantially the same level as that of the upper surface of the wafer 32. The surface of the reference flat 81 is provided by a metal film such as Cr or Al, for example. The X-Y-Z stage 34 is movable in the direction (Z direction) of the optical axis of the projection optical system 31 and also along a plane (X–Y plane) perpendicular to that direction.

For transfer of the circuit pattern onto the wafer 32, a predetermined zone (pattern transfer zone) of the reticle 30 is illuminated with light from an illumination optical system 1.

Denoted at 52 and 53 are elements constituting a surface position detecting optical system which serves to detect the level of the surface of the wafer 32. Here, denoted at 52 is a light projecting optical system adapted to project plural lights for detection of any inclination of the reference flat 81. Each light as projected by the light projecting optical system 52 comprises non-exposure light (non-sensitizing light) to which a photoresist applied to the wafer is substantially insensitive. Each of these lights is converged upon the reference flat 81 (or the upper surface of the wafer 32) and is reflected thereby.

The light reflected by the reference flat 81 enters a detection optical system 53. While not illustrated in the drawing, the detection optical system includes a plurality of light receiving elements, disposed therewithin correspondingly to the reflected lights entering the detection optical system, for detecting the positions of light spots. These light receiving elements are so disposed that their light receiving surfaces are placed substantially in an optically conjugate relationship with the points of reflection of the lights upon the reference flat 81 with respect to the imaging optical system 31. Thus, any positional deviation of the reference plane 81 in the direction of the optical axis 31b of the projection optical system 31 can be measured upon the position detecting light receiving elements of the detection optical system 53 as positional deviation of the incident lights.

This deviation of the reference flat 81 in the Z direction and from a focus reference position of the apparatus, being measured by the detection optical system 53, is calculated by a surface position detecting device 80 as the "surface position", this being done on the basis of output signals of the position detecting light receiving elements. In response, a signal is supplied to a spherical aberration measuring and controlling system 61 through a signal line, the signal representing a deviation, in the Z direction and from the focus reference position of the apparatus, of the position where a light for actually measuring the focus position in a TTL (Through The Lens) system impinges on the reference plane 81.

The spherical aberration measuring and controlling system 61 supplies a command signal via a signal line to a stage driving device 62, for driving the X-Y-Z stage 34 on which the reference flat 81 is fixedly mounted. Also, for measurement of spherical aberration of the projection optical system 31, the spherical aberration measuring and controlling system 61 supplies a command to the stage driving device 62 to move the X-Y-Z stage to displace the reference flat 81 upwardly and/or downwardly along the optical axis (Z direction) of the projection optical system 31, within a range about the predetermined reference position of the apparatus.

Now, the manner of measuring spherical aberration of the projection optical system 31 will be explained.

Figure 4:
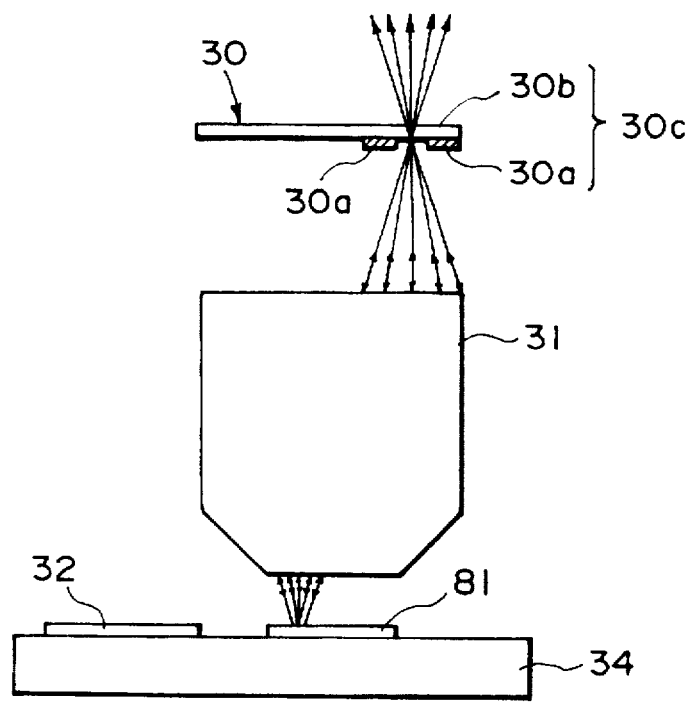
FIG. 4 is a schematic view for explaining the principle of measurement of spherical aberration and focus in the present invention.
Figure 5:
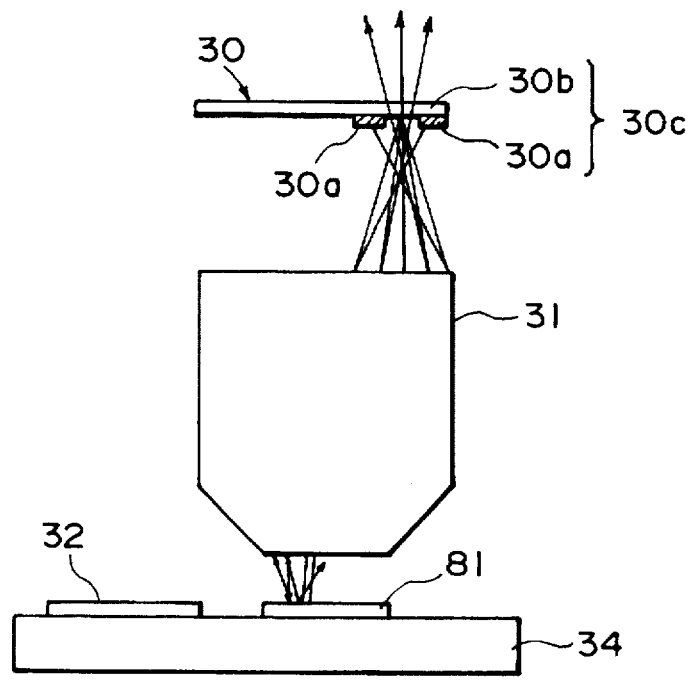
FIG. 5 is similar to FIG. 4, for further explaining the principle of measurement of spherical aberration and focus in the present invention.

Referring to FIGS. 4 and 5, denoted at 30 is a reticle, and denoted at 30a are pattern portions formed on the reticle 30 and having a light blocking performance. Denoted at 30b is a light transmitting portion being sandwiched by the pattern portions 30a, in this example. The pattern portions 30a and the light transmitting portion 30b cooperate to define a measurement mark 30c.

For measurement of spherical aberration of the projection optical system 31, as described, the X-Y-Z stage 34 moves along the optical axis of the projection optical system 31. The reference flat 81 is positioned just underneath the projection optical system 31, and the pattern portions 30a and the light transmitting portion 30b of the reticle 30 are illuminated by the spherical aberration measuring illumination optical system 1.

The spherical aberration measuring illumination optical system 1 has such a structure that; a portion of light, extracted from the exposure illumination optical system 1 and having the same wavelength as that of the exposure light, is directed as a detection beam by an optical fiber 82 and through an ND filter 64 to a collimator lens 65, and it irradiates an aperture stop 66. The aperture stop 66 has a shape and a size corresponding to the shape of a secondary light source defined by the illumination optical system 1.

Denoted at 64 is the ND filter for controlling the light quantity. Its optical density is set to provide a spherical aberration measuring light of a suitable light quantity. The light from the aperture stop 66 is divided by a polarization beam splitter 67 into S-polarized light advancing through a quarter waveplate 68, an objective lens 69 and a mirror 70 in this order to illuminate the reticle 30, and P-polarized light advancing through a condensing lens 74 and impinging on a light receiving element 75 of a reference light quantity detecting system. The light which illuminates the reticle 30 is adjusted by the aperture stop 66 so that the same NA as the illumination optical system performing the exposure operation is set therefor.

The reflected light passing through the reticle 30 and the projection optical system 31 is reflected by the reference flat 81, and it goes back along its oncoming path. However, due to the function of the quarter waveplate 68, it goes through the polarization beam splitter 67. After passing a relay lens 71, it impinges on a light receiving element 72 which serves as a detecting means for measurement of spherical aberration. The light receiving element 72 is operable to detect the imaging state of an image of the pattern 30a upon the reference flat 81.

If the output of the illumination optical system fluctuates largely or it changes largely with time, a result of dividing an output signal of the light receiving element 72 by an output signal of the light receiving element 75, may be used as a spherical aberration measurement output. If not so, however, the output of the light receiving element 72 may be used directly.

Referring to FIG. 4, d case where in this embodiment the surface of the reference flat 81 is just on the focal plane of the projection optical system 31 will be explained.

The light passing the light transmitting portion 30b of the reticle 30 is collected by the projection optical system 31 upon the reference flat 81, and it is reflected thereby. The reflected light goes back along on its oncoming path through the projection optical system 31, and it impinges on the reticle 30. The light then goes through the light transmitting portion 30b between the pattern portions 30a of the reticle 30. At this time, only a small portion of the light is eclipsed by the pattern portions 30a of the reticle, and thus a large portion of the light goes through the light transmitting portion 30b.

Next, referring to FIG. 5, a case where the surface of the reference flat 81 is at a position deviated from the focal plane of the projection optical system 31 will be explained.

The light passing the light transmitting portion of the pattern portion 30a ot the reticle 30 is collected by the projection optical system 31 upon the reference flat 81, and it is reflected thereby. Here, the light is reflected by the reference flat as a divergent light. Thus, the reflected light goes back along a path different from it oncoming path. After passing the projection optical system 31, it is not focused but is projected on the reticle 30 in the form of light having an expansion corresponding to the the amount of deviation of the reference flat 81 from the focal plane of the projection optical system 31. Namely, the light is not focused on the reticle 30.

Here, a portion of the light is eclipsed by the pattern portions 30a of the reticle 30, such that all the light cannot pass through the light transmitting portion 30b. Therefore, between a case where coincidence with the focal plane is established and a case where it is not so, there is produced a difference in quantity of reflected light (intensity of reflected light) passing through the reticle.

Similarly, a difference in quantity of reflected light passing the reticle may be produced with the magnitude of spherical aberration of the projection optical system. Namely, even if the reference flat 81 coincides with the focal plane of the projection optical system 31, the quantity of reflected light passing the reticle 30 becomes larger with a smaller spherical aberration, than that with a larger spherical aberration.

Now, the manner of measuring the spherical aberration of the projection optical system 31 based on this principle, will be explained.

Figure 6:
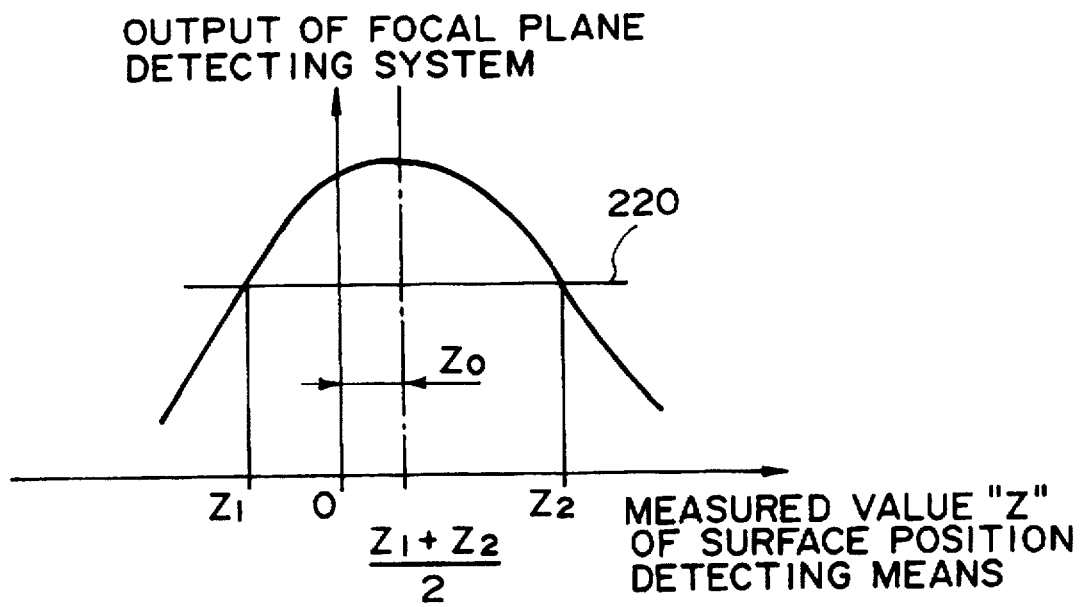
FIG. 6 is a graph for explaining the relationship between the surface position and a a signal of a detecting system in the present invention.

First, the stage driving device 62 operates to move the X-Y-Z stage 34 on which the reference flat means 81 is mounted, in the direction of the optical axis of the projection optical system 33 and about a zero point having been predetermined by the surface position detecting device 80. Here, the surface position detecting device 80 monitors the position of the reference flat, at different locations, with respect to the direction of the optical axis. Taking these positions as Z, the relation of them with the light quantities detected by the light receiving element 72 at corresponding moments (or the value obtainable by dividing the light quantity detected by the light receiving element 72 by the light quantity detected by the light receiving element 75) may be such as illustrated in FIG. 6. The origin in FIG. 6 is a reference position of the apparatus.

As described hereinbefore, the peak of the curve (i.e. Z position $Z_0$) corresponds to the focal point position of the projection optical system 31. However, for convenience in determination of the peak position from discrete measurement points, any one of the following methods may be applicable:

(a) Slice method: A slice level 220 of a certain proportion to a peak output is set and, by detecting autofocus measured values $Z_1$ and $Z_2$ representing the outputs corresponding to this slice level 220, the focus position is determined as:

$$Z_0 = (Z_1 + Z_2)/2 \quad (1)$$

(b) Gravity center method: Gravity center processing is done to a light quantity output ($f_i$) and an autofocus measured value ($z_i$), and the focus position is determined as:

$$Z_0 = [\Sigma(z_i \times f_i)]/(\Sigma f_i) \quad (2)$$

(c) Function approximation method: Quadratic function approximation ($y = ax^2 + bx + c$) is done to a light quantity output ($f_i$) and an autofocus measured value ($z_i$), and the focus position is determined as:

$$Z_0 = -b/2a \quad (3)$$

Once the light quantity detected by the light receiving element 72 corresponding to the measured value $Z_0$ thus determined (or the value obtained by dividing the light quantity detected by the light receiving element 72 by the light quantity detected by the light receiving element 75) is known, then the amount of spherical aberration of the projection optical system 31 can be known. The relationship between the amount of actual spherical aberration and the light quantity as above can be predetermined on the basis of simulation or actual measurement, for example.

As an alternative to determining the amount of spherical aberration of the projection optical system 31 from the curve in FIG. 6, it may be determined not on the basis of the light quantity directly as described but on the basis of the manner of changed in light quantity. More specifically, the method is based on the phenomenon that: if the spherical aberration is large, there occurs a blur even at the best focus position, and the magnitude of this blur does not change largely in response to a deviation of focus. Thus, the amount of change in light quantity caused by changing the Z position becomes smaller.

In other words, the curve in FIG. 6 becomes slower with a larger spherical aberration. In the actual measurement operation to be done in such a case, taking $Z_2 - Z_2$ in FIG. 6 as an evaluation amount, the curve becomes slower (larger spherical aberration) with a larger evaluation amount. Also, in the gravity center method, calculating a quadratic moment as well as the gravity center, the moment becomes larger with a larger spherical aberration. Further, in the function approximation method, the value of the parameter "a" becomes smaller with a larger spherical aberration. In any case, these evaluation amounts may be predetermined and interrelated wish the amount of actual spherical aberration on the basis of simulation or actual measurement.

A further alternative may be that: two patterns of different linewidths are measured separately, and the amount of spherical aberration produced is determined on the basis of the difference between the best focus positions of them.

Next, a description will be made of the manner of controlling the spherical aberration of the projection optical system 31 to a desired level on the basis of the spherical aberration measured in the way described.

Figure 7:
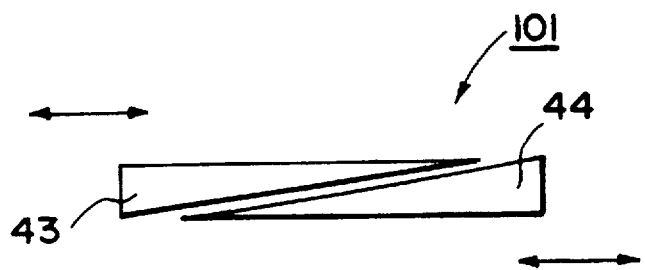
FIG. 7 is a schematic view of an example of a spherical aberration controlling mechanism according to the present invention.

In this embodiment, the spherical aberration is controlled by use of the paired optical wedges 43 and 44 described hereinbefore. FIG. 7 is an enlarged view of them. Each of these two optical wedges is coupled to a corresponding actuator (not shown) so that it can be moved laterally as illustrated. By moving one or both of the optical wedges, the thickness of the plate (parallel flat plate) 101 with respect to the light incident thereon is changed, whereby the amount of spherical aberration of the projection optical system 31 can be adjusted.

At this time, the focus position of the projection optical system 31 is also changed. In consideration thereof, the X-Y-Z stage 34 is moved in the direction of the optical axis of the projection optical system 31, to correct the focus. If, on this occasion, the TTL focus measurement is made again after correction of the spherical aberration, both the focus position of the projection optical system 31 and the spherical aberration thereof can be examined at once. Further, on an occasion when TTL wafer alignment is made or is going to be made, the baseline measurement may be done after correction of the spherical aberration. Elements denoted at 101, 61 and so on are the same components of the control means for controlling the spherical aberration.

In two cases, actually the quantity of spherical aberration may be problematic.

One is a case where an optimum spherical aberration is different depending on the type or thickness of a resist. The optimum value predetermined the type and thickness of a resist. Alternatively, by inputting the amount of spherical aberration directly into the apparatus, a computer 85 for controlling the apparatus as a whole is caused to signal a spherical aberration correcting driving system (not shown).

Figure 8:
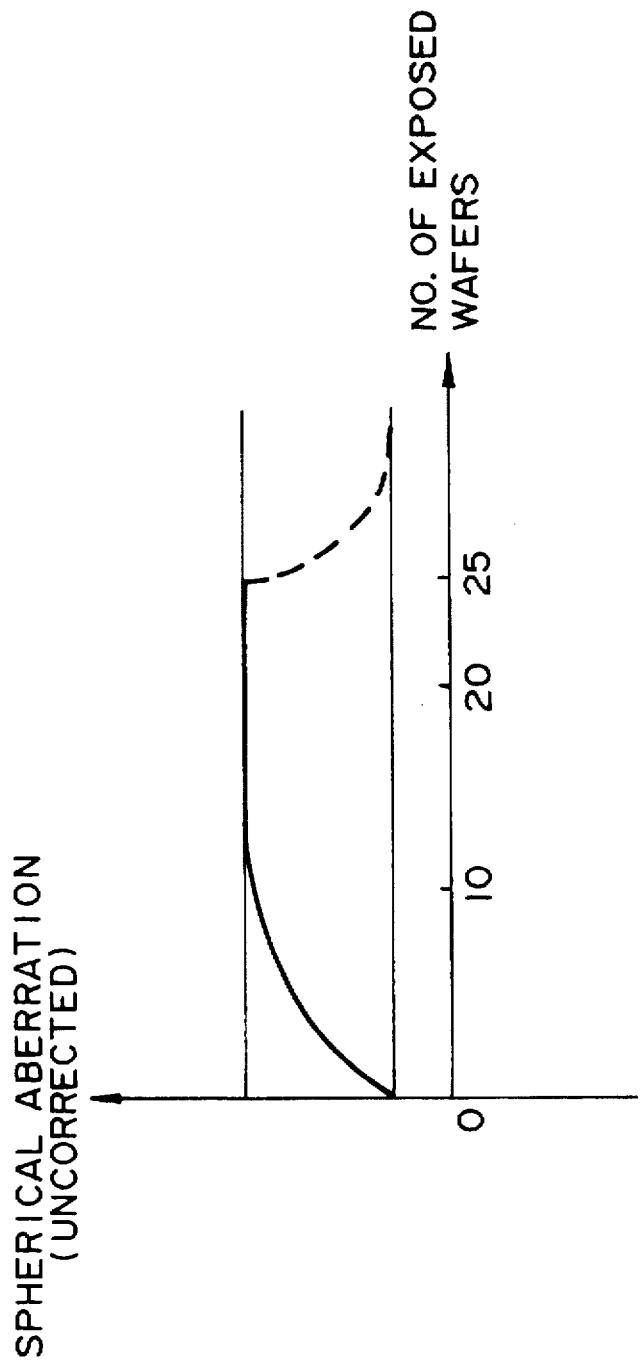
FIG. 8 is an illustration for explaining spherical aberration produced as a result of exposures.

The other is a case where the spherical aberration changes due to thermal absorption of the projection optical system 31. On this occasion, the spherical aberration changes from moment to moment. It changes exponentially, like changes in focus. It has been confirmed that the spherical aberration changes exponentially in the manner as illustrated in FIG. 8, toward a saturated value as determined by the quantity of exposure light inputted to the projection optical system, i.e., by the transmissivity of the reticle pattern, the exposure ON/OFF duty and the illuminance, for example.

Thus, correction of spherical aberration is to be done in a direction cancelling the change in optical characteristic of the projection optical system, with time. However, since correcting drive takes time, a certain limit may be set in relation to the amount of change and, if the limit is not exceeded, the correction may be deferred. The correction of spherical aberration may be executed in the period of wafer replacement. This may be convenient because it leads to a higher probability that the amount of change in spherical aberration during the exposure operation of one wafer is kept within the set limit.

The case where an exponential change is problematic is in the initial stage of a start of an exposure operation. The quantity of change of spherical aberration to be caused during the exposure operation of one wafer can be calculated, as known, from the condition of light quantity to be inputted, the resist sensitivity, the number of shots of one wafer and the reflectivity of the wafer, for example.

Thus, where spherical aberration correcting drive is to be done during the exposure operation of one wafer in an attempt to avoiding a decrease of throughput, a middle value between the spherical aberration at the initial stage of exposure of one wafer and that at the final stage thereof may preferably be set as the target value of spherical aberration to which the same is to be corrected.

The present invention is not limited to the form as described hereinbefore, but the following modifications are possible:

(1) For correction of spherical aberration, one lens element of the projection optical system 31 may be displaced along tho optical axis direction. Alternatively, parallel flat plates of different thicknesses may be interchangeably inserted into the optical path. Particularly, each parallel flat plate may desirably be placed just underneath the reticle or just before the wafer.

(2) For control of spherical aberration, the refractive index of a gas between optical elements of the projection optical system 31 may be changed. As a means for changing the refractive index of this gas, the pressure may be controlled or. alternatively, the ratio of mixture of different gaseous fluids may be controlled.

(3) For control of spherical aberration, the projection optical system 31 may be heated or cooled. Heating/cooling the projection optical system 31 causes physical deformation of an optical element or elements of the projection optical system 31 or a change in refractive index, whereby the spherical aberration is changed.

(4) For control of spherical aberration, the wavelength of light of the illumination optical system 1 of the projection exposure apparatus may be changed. If the wavelength is changed and it is deviated from that wavelength with respect to which the projection optical system 31 is chromatic-aberration corrected, the chromatic spherical aberration changes. This may be most effective in a case where a light source of variable wavelength such as a band-narrowed excimer laser, for example, is used.

(5) For control of spherical aberration, the wave bandwidth of a light source of the illumination optical system of the projection exposure apparatus may be changed. If the bandwidth is changed, due to on-axis chromatic aberration of the projection optical system 31, the expansion of defocus changes, causing a change in spherical aberration. This may be most effective in a case where a eight source of variable bandwidth such as a band-narrowed excimer laser, for example, is used.

Figure 9:
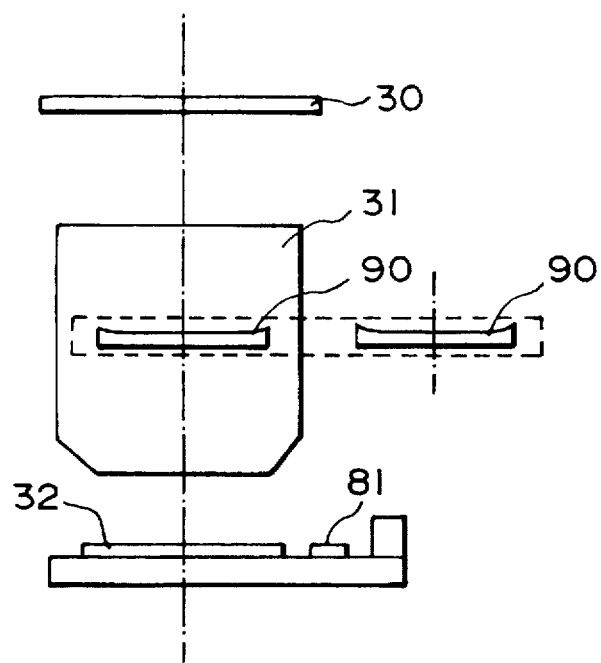
FIG. 9 is a schematic view of an example of a spherical aberration correcting mechanism according to the present invention.

(6) For control of spherical aberration, rotationally symmetrical aspherical members 90 (FIG. 9), each being effective to produce a predetermined spherical aberration, may be interchangeably disposed at the pupil position of the projection optical system 31.

(7) For measurement of spherical aberration, an alternative method other than those described hereinbefore is that: While moving the X-Y-Z stage 34 in the direction of the optical axis of the projection optical system 31, patterns are sequentially printed on a wafer covered by a resist and, after development of the resist, the linewidths of the developed patterns are measured. On the basis of any tilt of pivotal as described, the spherical aberration to be produced can be determined through conversion.

(8) For measurement of spherical aberration, in place of illuminating the marks 30a and 30b of the reticle 30 such that light therefrom is reflected by the reference flat 81 of substantially the same level as the wafer 32 and then goes back again through the projection optical system 31, the reference flat 81 may be provided with a mark which is to be illuminated: the light therefrom being reflected by the lower surface of the reticle 30 and going through the projection optical system 31, again, and the quantity of light passing the mark upon the reference flat 81 to be detected. On that occasion, the spherical aberration measuring system of the components 64–75 all should be disposed within the X-Y-Z stage 34 under the reference flat 81. The detection processes subsequent to that described above may be the same as those described hereinbefore.

(9) For measurement of spherical aberration, in addition to illuminating the marks 30a and 30b of the reticle 30, but in place of causing the light to be reflected by the reference flat 81 of substantially the same level as the wafer 32, the reference flat 81 may also be provided with a mark which has an analogous shape as the mark of the reticle 30 and which has a size equivalent to that of the reticle 30 mark as multiplied by the magnification of the projection optical system 31: the quantity of light passing the mark of the reference flat to be measured. On that occasion, of the spherical aberration measuring system of components 64–75, the elements 71 and 72 should be disposed under the reference flat 81 while the remaining elements should be disposed above the reticle 30. The detection processes subsequent to this may be the same as those described hereinbefore.

(10) For measurement of spherical aberration, as compared with the method described in item (9), the reference flat 81 may be provided with a mark which has a shape analogous to that of the mark of the reticle 30 and which has a size equivalent to that of the reticle mark as multiplied by the magnification of the projection optical system 31: the mark of the reference pattern being illuminated from below.

and the quantity of light passing that mark to be measured. On that occasion, of the spherical aberration measuring system of components 64–75, the elements 71 and 72 should be disposed above the reticle while the remaining elements should be disposed below the reference flat 81. The detection process subsequent to this may be the same as those having been described hereinbefore.

On the other hand, as regards the spherical aberration attributable to the exposure process, with the repetition of an exposure operation in a projection exposure apparatus, the projection optical system absorbs the exposure light, resulting in heat causing physical deformation of an optical element of the projection optical system 31 or a change in refractive index thereof. Software for estimating and correcting current spherical aberration on the basis of history or hysteresis of exposure, can be applied to the projection optical system 31 simultaneously with the measurement of the spherical aberration.

(11) If the spherical aberration is changed in accordance with the method described above or the method described in any one of items (1)–(5). In many cases an optical characteristic or characteristics other than the spherical aberration are changed simultaneously. This may have to be corrected. Also, there may be cases where an optical characteristic or characteristics should be controlled to a desired (e.g. a case where magnification should be controlled for mix-and-matching). On that occasion, an optical element of the projection optical system, not contributable to control of spherical aberration, may be displaced or the refractive index of a gas between optical elements may be changed, to thereby control the optical characteristics as desired, other than the spherical aberration. Usually, the optical characteristic other than the spherical aberration and which may need to be controlled, may be one or more of focus (focus position), magnification and distortion, for example. Since the relationship between the optical characteristic to be corrected and the corresponding correcting means is approximately linear coupling, the number of characteristics to be corrected corresponds to the number of correcting means to be adopted.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus, comprising:

image forming means for forming an image of a pattern upon a photosensitive layer;

detecting means for detecting a spherical aberration of said image forming means;

changing means for changing the spherical aberration of said image forming means, said changing means comprising means for changing a wavelength of a radiation beam used in image formation by said image forming means; and controlling means for controlling said changing means in accordance with the spherical aberration detected by said detecting means.

2. An apparatus according to claim 1, wherein said image forming means comprises a projection lens system.

3. An apparatus according to claim 2, wherein said detecting means comprises a TTL image plane detecting optical system.

4. An exposure apparatus, comprising:

image forming means for forming an image of a pattern on a photosensitive layer with light;

spherical aberration detecting means for detecting spherical aberration of said image forming means; and means for changing a spherical aberration of said image forming means by changing a wavelength of the light.

5. A device manufacturing method comprising:

(i) providing an exposure apparatus comprising:

image forming means for forming an image of a pattern upon a photosensitive layer;

detecting means for detecting a spherical aberration of said image forming means;

changing means for changing the spherical aberration of said image forming means, said changing means comprising means for changing a wavelength of a radiation beam used in image formation by said image forming means; and controlling means for controlling said changing means in accordance with the spherical aberration detected by said detecting means; and (ii) exposing a substrate using the provided exposure apparatus, to manufacture a device.

6. A device manufacturing method including projecting a device pattern onto a photosensitive layer with light through a projection optical system, said method comprising the steps of:

detecting spherical aberration of the projection optical system; and changing a wavelength of the light on the basis of the detection to adjust spherical aberration of the projection optical system.

* * * * *

UNITED STATES PATENT AND TRADEMARK OFFICE
CERTIFICATE OF CORRECTION

PATENT NO. : 5,789,734
DATED : August 4, 1998
INVENTOR(S) : MAKOTO TORIGOE, ET AL.

Page 1 of 3

It is certified that error appears in the above-identified patent and that said Letters Patent is hereby corrected as shown below:

COLUMN 4:

Line 1, "the" (first occurrence) should be deleted; and
Line 26, "a a" should read --a--.

COLUMN 6:

Line 42, "75," should read --75--;
Line 46, "FIG. 4, d" should read --FIG. 4, a--;
Line 52, "on" should be deleted; and
Line 65, "ot" should read --of--.

COLUMN 7:

Line 2, "it" should read --its--; and
Line 30, "33" should read --31--.

COLUMN 8:

Line 15, "changed" should read --changes--;
Line 24, "$Z_2-Z_2$" should read --$Z_2-Z_1$--; and
Line 33, "wish" should read --with--.

UNITED STATES PATENT AND TRADEMARK OFFICE
CERTIFICATE OF CORRECTION

PATENT NO. : 5,789,734
DATED : August 4, 1998
INVENTOR(S) : MAKOTO TORIGOE, ET AL.

It is certified that error appears in the above-identified patent and that said Letters Patent is hereby corrected as shown below:

COLUMN 9:

Line 19, "characteristic" should read --characteristics--; and
    Line 37, "avoiding" should read --avoid--.

COLUMN 10:

Line 13, "eight" should read --light--; and
    Line 38, "31, again," should read --31 again,--.

UNITED STATES PATENT AND TRADEMARK OFFICE
CERTIFICATE OF CORRECTION

PATENT NO. : 5,789,734
DATED : August 4, 1998
INVENTOR(S) : MAKOTO TORIGOE, ET AL.

It is certified that error appears in the above-identified patent and that said Letters Patent is hereby corrected as shown below:

COLUMN 11:

Line 16, "exposure," should read --exposure--;
Line 21, "(1)-(5). In" should read --(1)-(5), in--; and
Line 36, "characteristic" should read --characteristics--.

Signed and Sealed this

Thirteenth Day of April, 1999

Q. TODD DICKINSON

Attest:

Attesting Officer

Acting Commissioner of Patents and Trademarks